(12) United States Patent
Nozawa et al.

(10) Patent No.: US 11,081,321 B2
(45) Date of Patent: Aug. 3, 2021

(54) SUBSTRATE PROCESSING APPARATUS

(71) Applicant: TOKYO ELECTRON LIMITED, Tokyo (JP)

(72) Inventors: Syuji Nozawa, Nirasaki (JP); Yoji Iizuka, Tokyo (JP); Tatsuya Yamaguchi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 30 days.

(21) Appl. No.: 16/560,151

(22) Filed: Sep. 4, 2019

(65) Prior Publication Data

US 2020/0083029 A1 Mar. 12, 2020

(30) Foreign Application Priority Data

Sep. 6, 2018 (JP) .............................. JP2018-166546

(51) Int. Cl.
*H01J 37/32* (2006.01)
(52) U.S. Cl.
CPC .. *H01J 37/32844* (2013.01); *H01J 37/32449* (2013.01); *H01J 37/32862* (2013.01); *H01J 2237/3321* (2013.01)
(58) Field of Classification Search
CPC ........... H01J 37/32844; H01J 37/32449; H01J 37/32862; H01J 2237/3321; Y02C 20/30; H01L 21/67017; C23C 14/56; C23C 14/24; C23C 14/12; C23C 14/0021
USPC ..... 118/715, 695, 696, 697, 698; 156/345.1, 156/345.33, 345.34
See application file for complete search history.

(56) References Cited

U.S. PATENT DOCUMENTS

| 4,788,082 A | * | 11/1988 | Schmitt | B22F 9/12 427/248.1 |
| 2002/0066535 A1 | * | 6/2002 | Brown | B01D 53/32 156/345.29 |
| 2007/0160757 A1 | * | 7/2007 | Ishizaka | C23C 16/4401 427/248.1 |
| 2012/0247386 A1 | * | 10/2012 | Sanchez | C30B 23/063 117/99 |
| 2018/0305815 A1 | * | 10/2018 | Seo | H01L 21/68771 |

FOREIGN PATENT DOCUMENTS

| WO | 2008129925 A1 | 10/2008 |
| WO | 2010103953 A1 | 9/2010 |

* cited by examiner

*Primary Examiner* — Rudy Zervigon
(74) *Attorney, Agent, or Firm* — Nath, Goldberg & Meyer; Jerald L. Meyer; Tanya E. Harkins

(57) ABSTRACT

There is provided a substrate processing apparatus including: a chamber in which a target substrate is accommodated; a first gas supply part configured to supply a gas containing a first monomer, and a gas containing a second monomer, which forms a polymer through a polymerization reaction with the first monomer, into the chamber so as to form a film of the polymer on the target substrate; an exhaust device configured to exhaust a gas inside the chamber; a first exhaust pipe configured to connect the chamber and the exhaust device; and an energy supply device configured to supply an energy with respect to a gas flowing through the first exhaust pipe so as to cause an unreacted component of at least one of the first monomer and the second monomer contained in the gas exhausted from the chamber to be reduced in a molecular weight.

4 Claims, 6 Drawing Sheets

| Temperature of Substrate | [°C] | 90 | 100 | 110 | 120 |
|---|---|---|---|---|---|
| Mean Value | [nm/min] | 0.5 | 3.0 | 8.8 | 14.2 |
| Maximum Value | [nm/min] | 4.0 | 7.0 | 16.0 | 27.3 |
| Minimum Value | [nm/min] | 0.2 | 1.1 | 4.4 | 7.1 |
| \|Mean Value - Maximum Value\| | [nm] | 3.5 | 4.0 | 7.2 | 13.1 |
| \|Mean Value - Minimum Value\| | [nm] | 0.3 | 1.9 | 4.4 | 7.1 |

SUBSTRATE PROCESSING APPARATUS

CROSS-REFERENCE TO RELATED APPLICATION

This application is based upon and claims the benefit of priority from Japanese Patent Application No. 2018-166546, filed on Sep. 6, 2018, the entire contents of which are incorporated herein by reference.

TECHNICAL FIELD

Various aspects and embodiments of the present disclosure relate to a substrate processing apparatus.

BACKGROUND

There is known a technique that supplies a gas containing two types of monomers into a processing container in which a target substrate is accommodated, and forms an organic film on the target substrate by a polymerization reaction between the two types of monomers. For example, there is known a technique for forming a polymer film on a target substrate by a vacuum deposition polymerization reaction between an aromatic alkyl, alicyclic or aliphatic diisocyanate monomer, and an aromatic alkyl, alicyclic or aliphatic diamine monomer (see, for example, Patent Documents 1).

In addition, there is known a technique for removing a monomer from an exhaust gas by disposing a trap controlled to a temperature at which the monomer is polymerized in an exhaust path, and trapping an unreacted monomer contained in the exhaust gas as a polymer using the trap (see, for example, Patent Document 2).

PRIOR ART DOCUMENT

Patent Documents

Patent Document 1: International Publication No. WO2008/129925
Patent Document 2: International Publication No. WO2010/103953

Meanwhile, all of the monomers that are contained in the gas supplied into a processing container do not contribute to such a reaction. Thus, the monomers not contributing to the reaction are exhausted from the processing container. However, in the course of exhausting, a polymerization reaction between monomers may occur, which forms an organic film (hereinafter, referred to as "deposits") in the exhaust path. When such deposits are formed on a pressure adjustment valve, an exhaust pump, or the like provided in the exhaust path, it becomes difficult to maintain the inside of the processing container at a predetermined pressure.

Therefore, in order to prevent the polymerization reaction from occurring in the exhaust path, it is conceivable to heat the entire exhaust path. However, the heating of the entire exhaust path leads to an increase in size of an apparatus due to the arrangement of a heating member and an increase in power consumption. In addition, when an unreacted monomer contained in the exhaust gas is captured in the form of a polymer using a trap disposed in the exhaust path, it is necessary to periodically remove the polymer generated in the trap. Therefore, an exhaust mechanism is periodically stopped, which prolongs a down time of the film forming apparatus.

SUMMARY

According to an embodiment of the present disclosure, there is provided a substrate processing apparatus including: a chamber in which a target substrate is accommodated; a first gas supply part configured to supply a gas containing a first monomer, and a gas containing a second monomer, which forms a polymer through a polymerization reaction with the first monomer, into the chamber so as to form a film of the polymer on the target substrate; an exhaust device configured to exhaust a gas inside the chamber; a first exhaust pipe configured to connect the chamber and the exhaust device; and an energy supply device configured to supply an energy with respect to a gas flowing through the first exhaust pipe so as to cause an unreacted component of at least one of the first monomer and the second monomer contained in the gas exhausted from the chamber to be reduced in a molecular weight.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments of a substrate processing apparatus of the present disclosure will be described in detail with reference to the drawings. The substrate processing apparatus of the present disclosure is not limited to the following embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as to avoid unnecessarily obscuring aspects of the various embodiments.

First Embodiment

[Configuration of Substrate Processing Apparatus]

Figure 1:
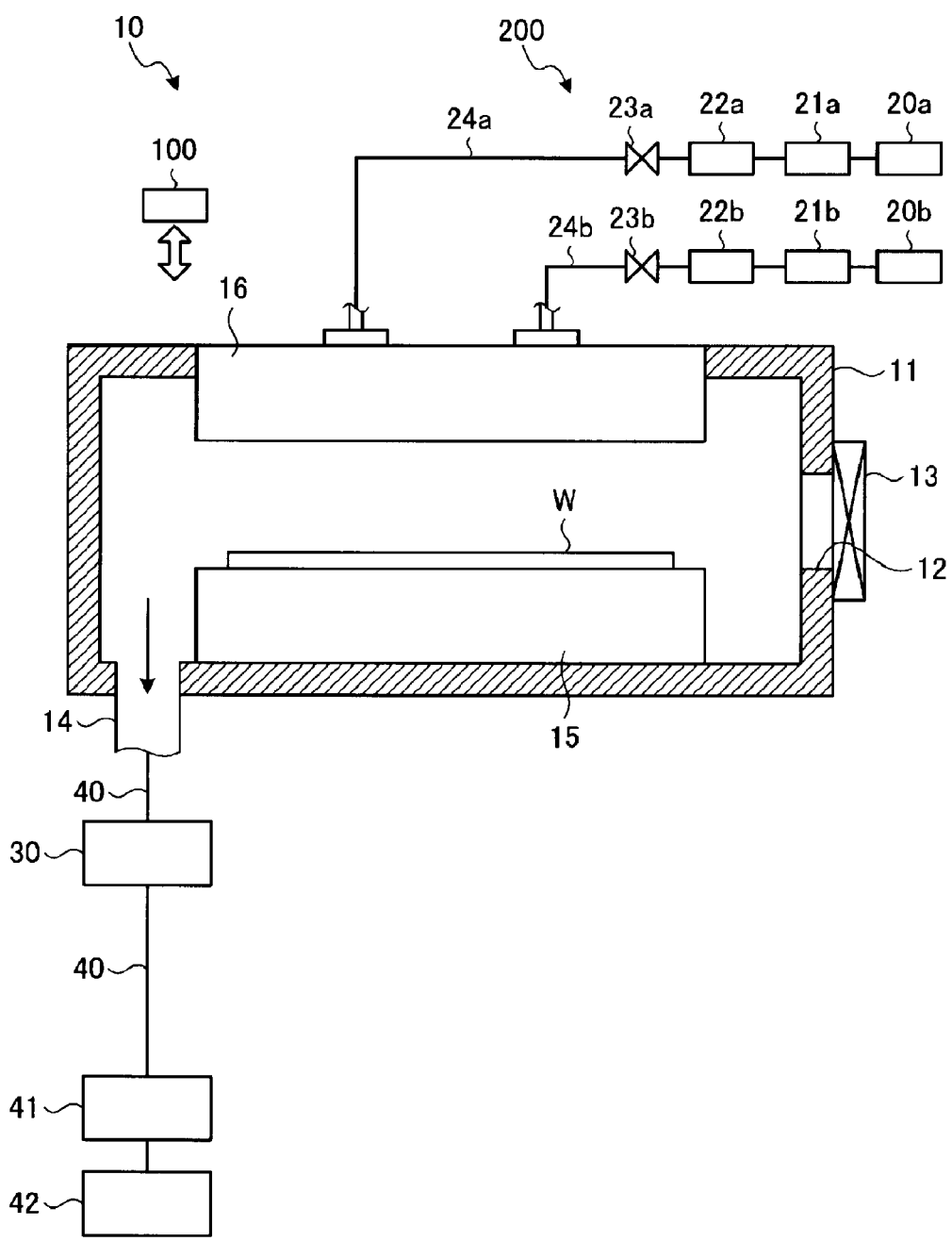
FIG. 1 is a schematic cross-sectional view illustrating an example of a substrate processing apparatus according to a first embodiment of the present disclosure.

FIG. 1 is a schematic cross-sectional view illustrating an example of a substrate processing apparatus 10 according to a first embodiment of the present disclosure. The substrate processing apparatus 10 may be an apparatus for forming an organic film on a target substrate W by a chemical vapor deposition (CVD). The substrate W may be a semiconductor wafer.

In the present embodiment, an organic film is formed on the target substrate W using two types of raw materials A and B. For example, in a case where the organic film formed on the target substrate W is an organic film of polyurea, the raw material A may be a diisocyanate monomer, and the raw material B may be a diamine monomer. The raw material A is an example of a first monomer, and the raw material B is an example of a second monomer. Diisocyanate and diamine on the front surface of the target substrate W are subjected to vapor deposition polymerization using the substrate processing apparatus 10, so that the organic film of polyurea is formed on the front surface of the target substrate W.

The substrate processing apparatus 10 includes a chamber 11, a plasma generation device 30, an exhaust pipe 40, a pressure adjustment valve 41, an exhaust device 42, a control device 100, and a first gas supply part 200. The plasma generation device 30 is an example of an energy supply device. The exhaust pipe 40 is an example of a first exhaust pipe.

The chamber 11 is a vacuum container having an inner wall that defines a vacuum atmosphere. The vacuum atmosphere may be a medium vacuum (100 to 0.1 Pa). A stage 15 on which the target substrate W is mounted is provided in the chamber 11. The stage 15 incorporates a temperature control mechanism (not illustrated) for controlling a temperature of the target substrate W. The temperature control mechanism controls the target substrate W to have a temperature suitable for the polymerization reaction of the raw material A and the raw material B.

An opening 12 through which the target substrate W is transferred is formed in a side wall of the chamber 11. The opening 12 can be opened/closed by a gate valve 13. A heater is embedded in an inner wall of the chamber 11 so as to heat the inner wall. By heating the inner wall of the chamber 11 by the heater, the amount of deposits adhering to the inner wall of the chamber 11 is reduced.

A shower head 16 is provided above the chamber 11 so as to supply gases of the raw material A and the raw material B supplied from the first gas supply part 200 into the chamber 11. A heater (not illustrated) is provided inside the shower head 16. The inner wall of the shower head 16 is heated by the heater. This suppresses the polymerization reaction between the gases of the raw material A and the raw material B inside the shower head 16.

An exhaust port 14 is formed below the side wall of the chamber 11. Gas in the chamber 11 is exhausted outward of the chamber 11 through the exhaust port 14.

The first gas supply part 200 includes a raw material source 20a, a raw material source 20b, a vaporizer 21a, a vaporizer 21b, a flow rate controller 22a, a flow rate controller 22b, a valve 23a, and a valve 23b. The raw material source 20a stores liquid of the raw material A as a first raw material, and supplies the raw material A staying in a liquid state to the vaporizer 21a. The vaporizer 21a vaporizes the liquid of the raw material A supplied from the raw material source 20a. The vaporizer 21a may include a heater (not illustrated). The vaporizer 21a vaporizes the liquid of the raw material A supplied from the raw material source 20a by heating the liquid of the raw material A using the heater.

The flow rate controller 22a controls a flow rate of the raw material A vaporized by the vaporizer 21a. The valve 23a controls the supply and cutoff of gas of the raw material A, the flow rate of which is controlled by the flow rate controller 22a, to the shower head 16. The gas of the raw material A supplied through the valve 23a is supplied to the shower head 16 through the supply pipe 24a. A mechanism for adjusting a temperature of the gas of the raw material A flowing through the supply pipe 24a, for example, a heater for heating the supply pipe 24a, is provided in the supply pipe 24a.

The raw material source 20b stores liquid of the raw material B as a second raw material, and supplies the raw material B staying in a liquid state to the vaporizer 21b. The vaporizer 21b vaporizes the liquid of the raw material B supplied from the raw material source 20b. The vaporizer 21b may include a heater. The vaporizer 21b vaporizes the liquid of the raw material B supplied from the raw material source 20b by heating the liquid of the raw material B using the heater.

The flow rate controller 22b controls a flow rate of the raw material B vaporized by the vaporizer 21b. The valve 23b controls the supply and cutoff of gas of the raw material B, the flow rate of which is controlled by the flow rate controller 22b, to the shower head 16. The gas of the raw material B supplied through the valve 23b is supplied to the shower head 16 through the supply pipe 24b. A mechanism for adjusting a temperature of the gas of the raw material B flowing through the supply pipe 24b, a heater for heating the supply pipe 24b, may be provided in the supply pipe 24b.

In addition to the gases of the raw material A and the raw material B, an inert gas such as an $N_2$ gas or an Ar gas may be added to the gas to be supplied from the first gas supply part 200 into the chamber 11 through the shower head 16.

The pressure adjustment valve 41 and the exhaust device 42 are connected to the exhaust port 14 via the exhaust pipe 40. The exhaust device 42 includes a vacuum pump, and exhausts the gas in the chamber 11 through the exhaust pipe 40 and the pressure adjustment valve 41. The pressure adjustment valve 41 adjusts a degree of opening thereof to adjust an exhaust amount of the exhaust device 42 so that an internal pressure of the chamber 11 is controlled to a predetermined pressure.

The plasma generation device 30 is provided in the exhaust pipe 40 between the exhaust port 14 and the pressure adjustment valve 41. The plasma generation device 30 forms the gas flowing through the exhaust pipe 40 into a plasma by supplying high-frequency power to the gas flowing through the exhaust pipe 40. In the present embodiment, the plasma generation device 30 forms the gas flowing through the exhaust pipe 40 into a plasma by an inductively coupled plasma.

In some embodiments, the plasma generation device 30 may form the gas flowing through the exhaust pipe 40 into a plasma by plasma formed by a manner other than the inductive coupling manner Examples of the plasma formed by a manner other than the inductive coupling manner may include a capacitively coupled plasma (CCP), a microwave excited surface wave plasma (SWP), an electron cyclotron resonance plasma (ECP), and a helicon wave excited plasma (HWP).

The control device 100 includes a memory, a processor, and an input/output interface. The processor controls the respective parts of the substrate processing apparatus 10 via the input/output interface by reading and executing a program or recipe stored in the memory. The control device 100 controls the vaporizer 21a, the vaporizer 21b, the flow rate controller 22a, and the flow rate controller 22b via the input/output interface by reading and executing a program or recipe stored in the memory. In addition, the control device 100 controls the valve 23a, the valve 23b, the plasma generation device 30, the pressure adjustment valve 41, and the exhaust device 42 via the input/output interface by reading and executing a program or recipe stored in the memory.

In the case of forming the organic film which is a polymer of two types of monomers on the target substrate W, a gas containing the two types of monomers is supplied from the shower head 16 into the chamber 11. However, all of the monomers contained in the gas supplied into the chamber 11 do not contribute to the reaction. Thus, the monomers that did not contribute to the reaction are exhausted from the chamber 11 by the exhaust device 42.

The monomers exhausted from the chamber 11 may form polymer deposits, by the polymerization reaction, on a front surface of a member present in the exhaust path in the course of flowing through the exhaust path. Deposits may be formed on the pressure adjustment valve 41, the exhaust device 42, and the like. Such deposits degrades the performance of the pressure adjustment valve 41, the exhaust device 42 and the like. Therefore, it is conceivable to suppress the polymerization reaction by heating the pressure control valve 41, the exhaust device 42, and the like. This causes problems such as an increase in size of the apparatus and an increase in power consumption due to the arrangement of a heating member.

Therefore, in the substrate processing apparatus 10 according to the present embodiment, the plasma generation device 30 is provided in the exhaust path between the chamber 11 and the exhaust device 42 to form the exhausted gas into a plasma. By irradiating the exhaust gas with the plasma generated by the plasma generation device 30, at least one of two types of monomers, which were contained in the exhaust gas but did not contribute to the polymerization reaction, namely unreacted components, is reduced in molecular weight. For example, a functional group of at least one of two types of monomers, which were contained in the exhausted gas but did not contribute to the polymerization reaction, are defunctionalized (namely, are decomposed). As a result, at the downstream side of the plasma generation device 30 in the exhaust path, the polymerization reaction by the exhausted gas is suppressed. It is therefore possible to suppress the deposits of the polymers adhering to the pressure control valve 41, the exhaust device 42 and the like, which suppresses the deterioration in the performance of the pressure control valve 41, the exhaust device 42, and the like.

In addition, even if all of the unreacted components of at least one of the two types of monomers are not reduced in molecular weight, it is possible to suppress the amount of deposits of the polymers adhering to the pressure control valve 41, the exhaust device 42, and the like, compared to a case in which the plasma generation device 30 does not radiate plasma. As a result, it is possible to extend the cleaning cycle of members such as the pressure control valve 41, the exhaust device 42 and the like, thus improving the throughput of the process.

In the foregoing, the first embodiment has been described. The substrate processing apparatus 10 of the present embodiment includes the chamber 11, the first gas supply part 200, the exhaust device 42, the exhaust pipe 40, and the plasma generation device 30. The chamber 11 accommodates the substrate W. The first gas supply part 200 supplies a gas containing the first monomer and a gas containing the second monomer, which forms a polymer through a polymerization reaction with the first monomer, into the chamber 11 so as to form a film of the polymer on the target substrate W. The exhaust device 42 exhausts the gas in the chamber 11. The exhaust pipe 40 interconnects the chamber 11 and the exhaust device 42. The plasma generation device 30 supplies energy to the gas flowing through the exhaust pipe 40, thereby causing the unreacted components of at least one of the first monomer and the second monomer contained in the gas exhausted from the chamber 11 to be reduced in molecular weight. Therefore, it is possible to suppress the deposits of the polymers adhering to the pressure control valve 41, the exhaust device 42, and the like, thus suppressing the deterioration in the performance of the pressure control valve 41, the exhaust device 42, and the like.

In the above embodiment, the plasma generation device 30 supplies energy to the gas flowing through the exhaust pipe 40 using the plasma generated by supplying high-frequency power to the gas flowing through the exhaust pipe 40, thereby causing the unreacted components of at least one of the first monomer and the second monomer contained in the gas exhausted from the chamber 11 to be reduced in molecular weight. As a result, at the downstream side of the plasma generation device 30 in the exhaust path, the polymerization reaction by the exhausted gas is suppressed.

Second Embodiment

The plasma generation device 30 according to the first embodiment generates plasma using only the gas exhausted from the chamber 11. Therefore, depending on the conditions of the gas flowing through the exhaust pipe 40, it may be difficult to stably generate plasma in some cases. Accordingly, in the plasma generation device 30 of the second embodiment, at the upstream side of the plasma generation device 30 in the exhaust path, a gas for assisting stable generation of plasma is added to the gas flowing through the exhaust path. An example of the gas for assisting the stable generation of plasma may include an inert gas such as an Ar gas.

[Configuration of Substrate Processing Apparatus]

Figure 2:
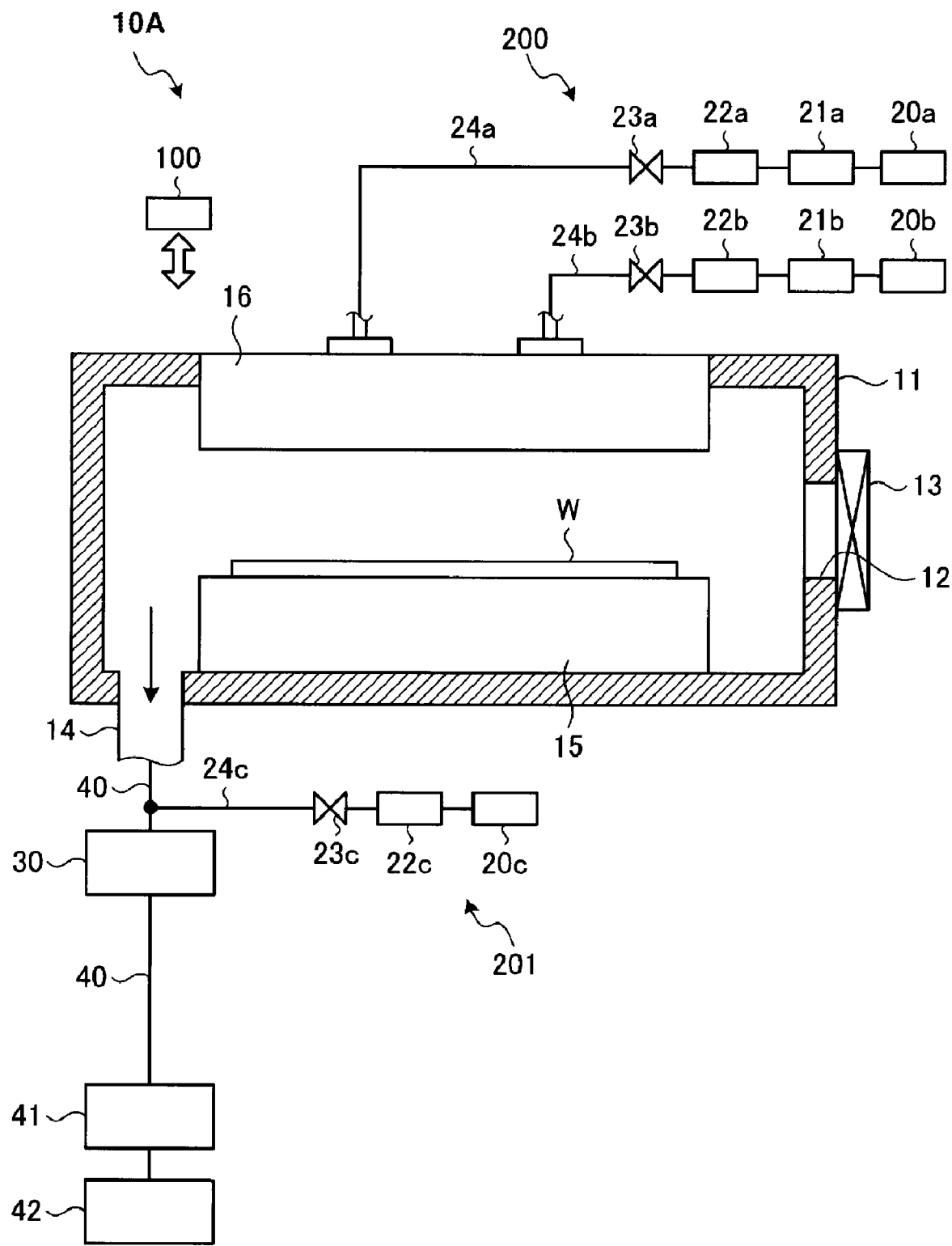
FIG. 2 is a schematic cross-sectional view illustrating an example of a substrate processing apparatus according to a second embodiment of the present disclosure.

FIG. 2 is a schematic cross-sectional view illustrating an example of a substrate processing apparatus 10A according to the second embodiment of the present disclosure. For example, as illustrated in FIG. 2, the substrate processing apparatus 10A according to the second embodiment includes the chamber 11, the plasma generation device 30, the exhaust pipe 40, the pressure adjustment valve 41, the exhaust device 42, the control device 100, the first gas supply part 200, and a second gas supply part 201. Components in FIG. 2 denoted by the same reference numerals as components in FIG. 1 have functions equal to or similar to those of the components shown in FIG. 1 except for matters to be described below, and therefore, descriptions thereof will be omitted.

The second gas supply part 201 includes a gas source 20c, a flow rate controller 22c, and a valve 23c. The gas source 20c supplies an additive gas such as an Ar gas for assisting the stable generation of plasma. The flow rate controller 22c controls a flow rate of the gas supplied from the gas source 20c. The valve 23c controls the supply and cutoff of a gas, the flow rate of which is controlled by the flow rate controller 22c, to the exhaust pipe 40. The additive gas supplied through the valve 23c is supplied into the exhaust pipe 40 between the exhaust port 14 and the plasma generation device 30 through the supply pipe 24c.

The plasma generation device 30 supplies high-frequency power to a mixed gas of the gas exhausted from the chamber 11 and the additive gas supplied from the second gas supply part 201, thereby forming the gas flowing through the exhaust pipe 40 into a plasma.

In the foregoing, the second embodiment has been described. The substrate processing apparatus 10A in the second embodiment includes the second gas supply part 201 that supplies the inert gas into the exhaust pipe 40 between the chamber 11 and the plasma generation device 30. This makes it possible to more stably generate plasma using the gas flowing through the exhaust path. This reduces the molecular weight of a greater portion of unreacted components of at least one of the two types of monomers that are contained in the exhausted gas. Thus, it is possible to effectively suppress the deposits of polymers adhering to the pressure control valve 41, the exhaust device 42, and the like.

Third Embodiment

The plasma generation device 30 of the first and second embodiments described above uses plasma to reduce the deposits adhering to the exhaust path by the gas exhausted from the chamber 11 during the film forming process. In contrast, the plasma generation device 30 of the third embodiment cleans the deposits adhering inside the chamber 11 through the polymerization reaction by further supplying active species contained in the plasma into the chamber 11.

[Configuration of Substrate Processing Apparatus]

Figure 3:
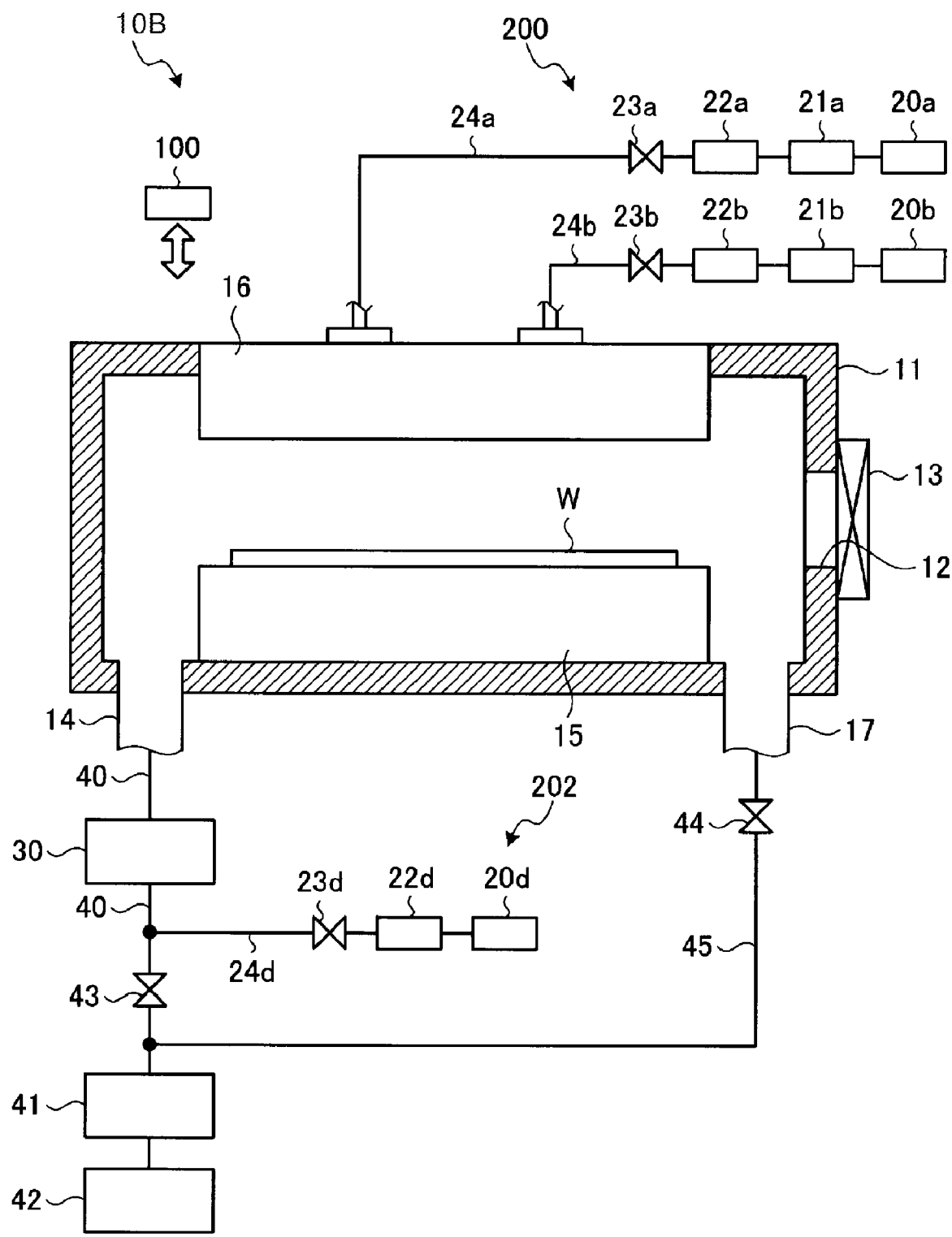
FIG. 3 is a schematic cross-sectional view illustrating an example of a substrate processing apparatus according to a third embodiment of the present disclosure.

FIG. 3 is a schematic cross-sectional view illustrating an example of a substrate processing apparatus 10B according to the third embodiment of the present disclosure. As illustrated in FIG. 3, the substrate processing apparatus 10B according to the third embodiment includes the chamber 11, the plasma generation device 30, the exhaust pipe 40, the pressure adjustment valve 41, the exhaust device 42, the control device 100, the first gas supply part 200, and a third gas supply part 202. For example, as illustrated in FIG. 3, the substrate processing apparatus 10B includes a valve 43, a valve 44, and an exhaust pipe 45. Components in FIG. 3 denoted by the same reference numerals as components in FIG. 1 have functions equal to or similar to those of the components shown in FIG. 1 except for matters to be described below, and therefore, descriptions thereof will be omitted.

The exhaust port 14 and an exhaust port 17 are formed below the side wall of the chamber 11. Gas in the chamber 11 is exhausted outward of the chamber 11 through any one of the exhaust port 14 and the exhaust port 17.

One end of the exhaust pipe 45 is coupled to the exhaust port 17 via the valve 44. The other end of the exhaust pipe 45 is connected to the exhaust pipe 40 between the plasma generation device 30 and the pressure control valve 41. The valve 43 is provided in the exhaust pipe 40 between the connection position of the exhaust pipe 40 and the exhaust pipe 45 and the plasma generation device 30. The valve 43 is an example of a first valve, and the valve 44 is an example of a second valve. The exhaust pipe 45 is an example of a second exhaust pipe.

The third gas supply part 202 includes a gas source 20d, a flow rate controller 22d, and a valve 23d. The gas source 20d supplies a cleaning gas. An example of the cleaning gas may include an oxygen-containing gas. In the present embodiment, the oxygen-containing gas may be a mixed gas of an inert gas and an $O_2$ gas. The inert gas may be an Ar gas. The oxygen-containing gas may be a mixed gas of an inert gas, an $O_3$ gas, and the like.

The flow rate controller 22d controls a flow rate of the cleaning gas supplied from the gas source 20d. The valve 23d controls the supply and cutoff of the cleaning gas, the flow rate of which is controlled by the flow rate controller 22d, to the exhaust pipe 40. The cleaning gas supplied through the valve 23d is supplied into the exhaust pipe 40 between the plasma generation device 30 and the valve 43 through the supply pipe 24d.

When the film forming process is performed by the substrate processing apparatus 10B, the plasma generation device 30 forms the gas flowing through the exhaust pipe 40 into a plasma by supplying high-frequency power to the gas exhausted from the chamber 11. When the substrate processing apparatus 10B performs the cleaning process, the plasma generation device 30 forms the cleaning gas into a plasma by supplying high-frequency power to the cleaning gas supplied from the third gas supply part 202.

[Film Forming Process]

Figure 4:
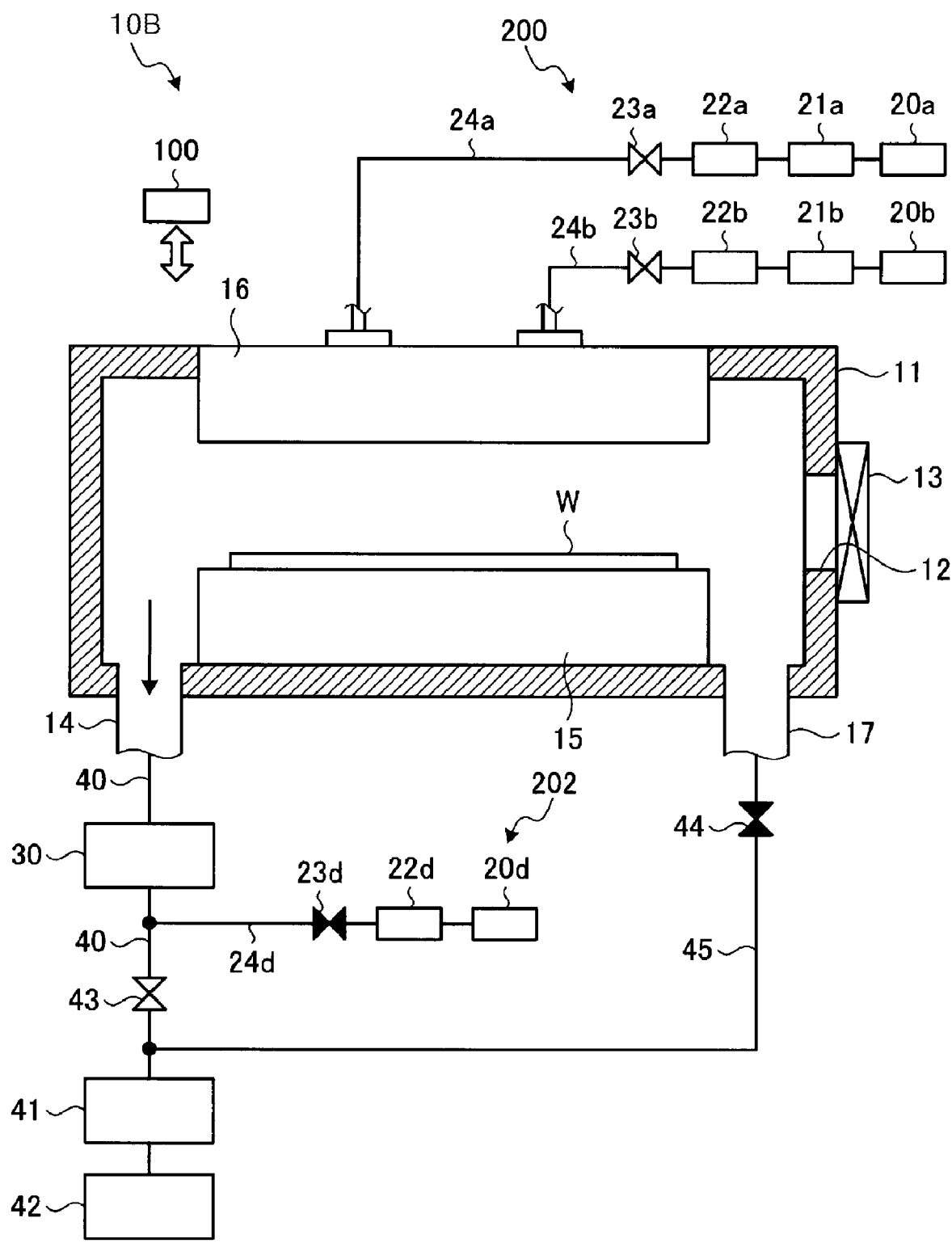
FIG. 4 is a view illustrating an example of the state of each valve during a film forming process.

FIG. 4 is a view illustrating an example of the state of each valve during the film forming process. When the film forming process is performed by the substrate processing apparatus 10B, for example, as illustrated in FIG. 4, the valve 23d and the valve 44 are closed, and the valve 23a, the valve 23b, and the valve 43 are opened. In FIG. 4, the opened valves are shown in white, and the closed valves are shown in black.

Thus, a gas containing the raw material A and the raw material B is supplied from the first gas supply part 200 into the chamber 11 so that the organic film of the polymer composed of the raw material A and the raw material B is formed on the substrate W. The gas containing the raw material A and the raw material B that did not contribute to the film formation is supplied to the plasma generation device 30 through the exhaust port 14 and the exhaust pipe 40. The gas is formed into a plasma by the plasma generation device 30. As a result, unreacted components of the raw material A and the raw material B contained in the exhaust gas are exhausted while being reduced in molecular weight.

[Cleaning Process]

Figure 5:
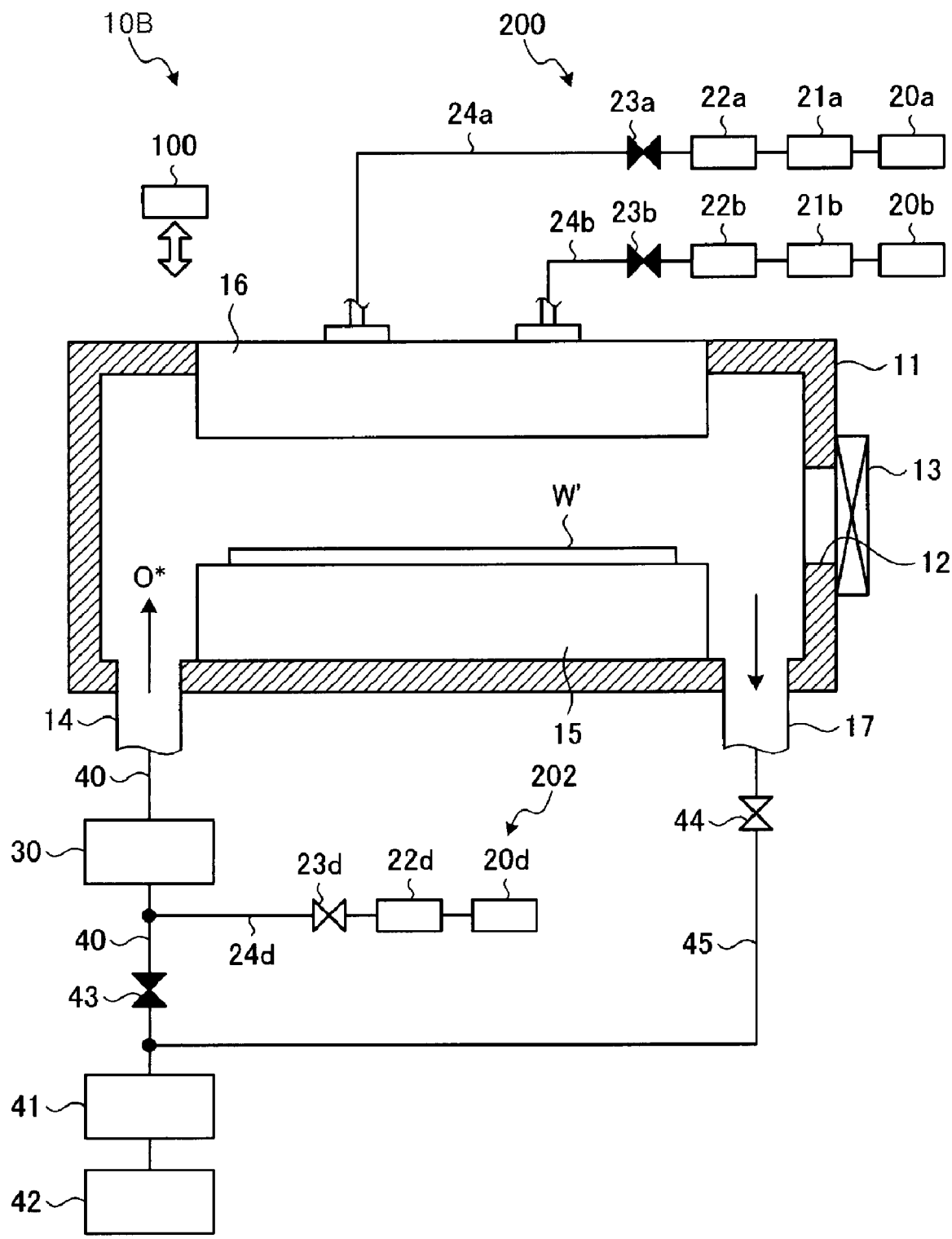
FIG. 5 is a view illustrating an example of the state of each valve during a cleaning process.

FIG. 5 is a view illustrating an example of the state of each valve during the cleaning process. When the cleaning process is performed by the substrate processing apparatus 10B, for example, as illustrated in FIG. 5, the valve 23a, the valve 23b, and the valve 43 are controlled to be closed, and the valve 23d and the valve 44 are controlled to be opened. In FIG. 5, the opened valves are shown in white, and the closed valves are shown in black. In addition, during the cleaning process, a dummy wafer W' may be mounted on the stage 15 in order to protect the upper surface of the stage 15.

The third gas supply part 202 supplies the cleaning gas to the plasma generation device 30. The plasma generation device 30 forms the cleaning gas into a plasma by supplying high-frequency power to the cleaning gas supplied from the third gas supply part 202. Active species such as oxygen radicals that are contained in the cleaning gas formed into the plasma are supplied into the chamber 11 through the exhaust pipe 40 and the exhaust port 14. By the active species supplied into the chamber 11, deposits adhering to the surfaces of the chamber 11, the stage 15, and the shower head 16 are removed. In the cleaning process, the gas in the chamber 11 is exhausted from the exhaust port 17 through the valve 44 and the exhaust pipe 45.

Experimental Results

Figures 6, 7:
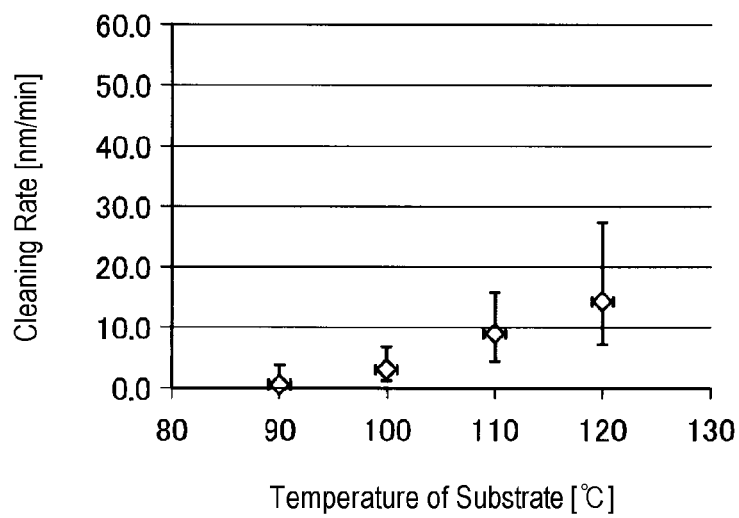
FIG. 6 is a diagram representing an example of experimental results of a cleaning rate.
FIG. 7 is a diagram representing an example of experimental results of a cleaning rate.

FIGS. 6 and 7 are diagrams representing an example of experimental results of a cleaning rate. In this experimental test, the target substrate W having an organic film formed thereon was mounted the stage 15, and the state of each valve was controlled as illustrated in FIG. 5. In addition, the etching rate of the organic film formed on the target substrate W by the active species contained in the plasma generated by the plasma generation device 30 was measured as a cleaning rate. Major conditions of the test are as follows.

Internal pressure of chamber 11: 1 [Torr]

Process time: 180 [sec]

Ar/O$_2$=500 [sccm]/300 [sccm]

As illustrated in FIGS. 6 and 7, the organic film on the target substrate W is cleaned even if the temperature of the target substrate W falls within a range of 90 degrees C. to 120 degrees C. The experimental results represented in FIGS. 6 and 7 shows that the cleaning rate tends to increase as the temperature of the target substrate W becomes higher. Accordingly, it is considered that it is possible to more effectively remove the deposits by setting the internal temperature of the chamber 11 at the cleaning process to be higher than the temperature at the film forming process.

In the foregoing, the third embodiment has been described. The substrate processing apparatus 10B in the third embodiment further includes the valve 43, the valve 44, the exhaust pipe 45, and the third gas supply part 202. The valve 43 is provided in the exhaust pipe 40 between the plasma generation device 30 and the exhaust device 42. The valve 44 is provided in the exhaust pipe 45. The exhaust pipe 45 interconnects the chamber 11 and the exhaust device 42. The third gas supply part 202 supplies the oxygen-containing gas into the exhaust pipe 40 between the plasma generation device 30 and the valve 43. When forming a polymer film on the target substrate W, the valve 43 is opened, the valve 44 is closed. The gas flowing from the chamber 11 to the exhaust device 42 through the exhaust pipe 40 is irradiated with plasma generated by the plasma generation device 30. In addition, when the interior of the chamber 11 is subjected to the cleaning process, the valve 43 is closed and the valve 44 is opened. The oxygen-containing gas supplied from the third gas supply part 202 is formed into a plasma by the plasma generation device 30. The interior of the chamber 11 is cleaned by active species contained in the plasma. This makes it possible to suppress the adhesion of deposits to the exhaust path and to implement the cleaning process on the interior of the chamber 11 using the plasma generation device 30.

In the third embodiment described above, the oxygen-containing gas may include an O$_2$ gas or an O$_3$ gas. This makes it possible to remove the deposits existing in the chamber 11 by the active species contained in the plasma of the oxygen-containing gas.

[Others]

The technology disclosed herein is not limited to the embodiments described above, and various modifications are possible within the scope of the gist of the present disclosure.

For example, in each of the substrate processing apparatus 10, 10A, 10B according to the first to third embodiments described above, the plasma generation device 30 is used as an example of an energy supply device, but the present disclosure is not limited thereto. For example, each of the substrate processing apparatus 10, 10A, 10B may include, as another example of the energy supply device, an ultraviolet irradiation device configured to irradiate the gas flowing through the exhaust pipe 40 with ultraviolet rays.

For example, during the film forming process, the ultraviolet irradiation device may supply energy to the gas flowing through the exhaust pipe 40 by irradiating the gas flowing through the exhaust pipe 40 with the ultraviolet rays. Thus, the unreacted components of at least one of the first monomer and the second monomer contained in the gas exhausted from the chamber 11 are reduced in molecular weight by the ultraviolet rays radiated from the ultraviolet irradiation device.

In addition, during the cleaning process, the ultraviolet irradiation device generates active species by irradiating the cleaning gas supplied from the third gas supply part 202 with the ultraviolet rays. The interior of the chamber 11 is cleaned by the generated active species. By providing the ultraviolet irradiation device instead of the plasma generation device 30, it is possible to realize the suppression of the adhesion of deposits to the exhaust path and the cleaning of the interior of the chamber 11.

Even in the substrate processing apparatus 10B of the third embodiment described above, as in the substrate processing apparatus 10A of the second embodiment described above, a gas for assisting the stable generation of plasma may be added to the gas flowing through the exhaust path at the upstream side of the plasma generation device 30 in the exhaust path.

According to various aspects and embodiments of the present disclosure, it is possible to suppress deposits adhering to an exhaust path.

It should be noted that the embodiments disclosed herein are exemplary in all respects and are not restrictive. Indeed, the above-described embodiments may be embodied in various aspects. The above-described embodiments may be omitted, replaced or modified in various forms without departing from the scope and spirit of the appended claims.

What is claimed is:

1. A substrate processing apparatus comprising: a chamber in which a target substrate is accommodated; a controller configured to control:
   (i). first gas supply part configured to supply a gas containing a first monomer, and a gas containing a second monomer, which forms a polymer through a polymerization reaction with the first monomer, into the chamber so as to form a film of the polymer on the target substrate;
   (ii). a second gas supply part configured to supply an inert gas into the first exhaust pipe between the chamber and an energy supply device; an exhaust device configured to exhaust a gas inside the chamber; a first exhaust pipe configured to connect the chamber and the exhaust device; the energy supply device configured to supply an energy with respect to a gas flowing through the first exhaust pipe so as to cause an unreacted component of at least one of the first monomer and the second monomer contained in the gas exhausted from the chamber to be reduced in a molecular weight; a second exhaust pipe configured to connect the chamber and the exhaust device; a first valve provided in the first exhaust pipe between the energy supply device and the exhaust device; a second valve provided in the second exhaust pipe; and
   (iii). a third gas supply part configured to supply a gas source of an oxygen-containing gas; and a supply pipe that is installed to connect the gas source to a portion of the first exhaust pipe between the energy supply device and the first valve to supply the oxygen-containing gas into the first exhaust pipe between the energy supply device and the first valve;
   (iv). the energy supply device supplying the energy with respect to the gas flowing through the first exhaust pipe using a plasma generated by supplying a high-frequency power to the gas flowing through the first exhaust pipe, so as to cause the unreacted component of the at least one of the first monomer and the second monomer contained in the gas exhausted from the chamber to be reduced in the molecular weight, wherein, when the film of the polymer is formed on the target substrate, the first valve is kept in an opened state and the second valve is kept in a closed state, so that the gas flowing from the chamber to the exhaust device through the first exhaust pipe is irradiated with the plasma generated by the energy supply device;

(v.) a cleaning process for the interior of the chamber, wherein the first valve is kept in the closed state and the second valve is kept in the opened state, so that the oxygen-containing gas supplied from the third gas supply part is formed into a plasma by the energy supply device, the cleaning process for the interior of the chamber subjected to active species contained in the plasma.

2. The substrate processing apparatus of claim 1, further comprising: a second gas supply part configured to supply an inert gas into the first exhaust pipe between the chamber and the energy supply device.

3. The substrate processing apparatus of claim 1, wherein the oxygen-containing gas contains an $O_2$ gas or an $O_3$ gas.

4. A substrate processing apparatus comprising: a chamber in which a target substrate is accommodated; a controller configured to control:

(i). a first gas supply part configured to supply a gas containing a first monomer, and a gas containing a second monomer, which forms a polymer through a polymerization reaction with the first monomer, into the chamber so as to form a film of the polymer on the target substrate;

(ii). a second gas supply part configured to supply an inert gas into the first exhaust pipe between the chamber and an energy supply device; an exhaust device configured to exhaust a gas inside the chamber; a first exhaust pipe configured to connect the chamber and the exhaust device, the energy supply device configured to supply an energy with respect to a gas flowing through the first exhaust pipe so as to cause an unreacted component of at least one of the first monomer and the second monomer contained in the gas exhausted from the chamber to be reduced in a molecular weight; a second exhaust pipe configured to connect the chamber and the exhaust device; a first valve provided in the first exhaust pipe between the energy supply device and the exhaust device; a second valve provided in the second exhaust pipe;

(iii). a third gas supply part including: a gas source that supplies an oxygen-containing gas; and a supply pipe that is installed to connect the gas source to a portion of the first exhaust pipe between the energy supply device and the first valve to supply the oxygen-containing gas into the first exhaust pipe between the energy supply device and the first valve;

(iv). the energy supply device supplies the energy with respect to the gas flowing through the first exhaust pipe by irradiating the gas flowing through the first exhaust pipe with ultraviolet rays, so as to cause the unreacted component of the at least one of the first monomer and the second monomer contained in the gas exhausted from the chamber to be reduced in the molecular weight, wherein, when the film of the polymer is formed on the target substrate, the first valve is kept in an opened state and the second valve is kept in a closed state, so that the gas flowing from the chamber to the exhaust device through the first exhaust pipe is irradiated with the ultraviolet rays from the energy supply device, and;

(v). a cleaning process for the interior of the chamber, wherein the first valve is kept in the closed state and the second valve is kept in the opened state, so that the cleaning process for the interior of the chamber is subjected to active species generated when the oxygen-containing gas supplied from the third gas supply part is irradiated with the ultraviolet rays from the energy supply device.

* * * * *